United States Patent
Lou et al.

(10) Patent No.: US 11,244,992 B2
(45) Date of Patent: Feb. 8, 2022

(54) DISPLAY PANELS, DISPLAY SCREENS, AND DISPLAY TERMINALS

(71) Applicants: YUNGU (GU'AN) TECHNOLOGY CO., LTD., Langfang (CN); KUNSHAN GO-VISIONOX OPTO-ELECTRONICS CO., LTD., Kunshan (CN); SUZHOU QINGYUE OPTOELECTRONICS TECHNOLOGY CO., LTD., Kunshan (CN)

(72) Inventors: Junhui Lou, Kunshan (CN); Yanan Ji, Kunshan (CN); Yanqin Song, Kunshan (CN); Leping An, Kunshan (CN)

(73) Assignees: YUNGU (GU'AN) TECHNOLOGY CO., LTD., Langfang (CN); KUNSHAN GO-VISIONOX OPTO-ELECTRONICS CO., LTD., Kunshan (CN); SUZHOU QINGYUE OPTOELECTRONICS TECHNOLOGY CO., LTD, Kunshan (CN)

(*) Notice: Subject to any disclaimer, the term of this patent is extended or adjusted under 35 U.S.C. 154(b) by 0 days.

(21) Appl. No.: 16/824,702

(22) Filed: Mar. 20, 2020

(65) Prior Publication Data
US 2020/0219967 A1 Jul. 9, 2020

Related U.S. Application Data

(63) Continuation of application No. PCT/CN2019/073267, filed on Jan. 25, 2019.

(30) Foreign Application Priority Data

Aug. 6, 2018 (CN) .......................... 201810886049.X

(51) Int. Cl.
*H01L 27/32* (2006.01)

(52) U.S. Cl.
CPC ........ *H01L 27/3246* (2013.01); *H01L 27/326* (2013.01); *H01L 27/3227* (2013.01); *H01L 27/3234* (2013.01); *H01L 27/3283* (2013.01)

(58) Field of Classification Search
CPC ............. H01L 27/3283; H01L 27/3227; H01L 27/3234; H01L 27/3246; H01L 27/326;
(Continued)

(56) References Cited

U.S. PATENT DOCUMENTS 4,665,342 A 5/1987 Topp et al.
9,312,312 B1 4/2016 Tsai et al.
(Continued)

FOREIGN PATENT DOCUMENTS

CN 105230125 A 1/2016
CN 104409659 B 2/2017
(Continued)

OTHER PUBLICATIONS

Office Action of Chinese Patent Application No. 201810886049.X.
(Continued)

*Primary Examiner* — Cheung Lee
(74) *Attorney, Agent, or Firm* — Kilpatrick Townsend & Stockton

(57) ABSTRACT

A display panel, a display screen, and a display terminal are provided. The display panel includes: a substrate; and a pixel definition layer formed on the substrate; pixel apertures formed on the pixel definition layer; the pixel aperture comprising a first type of pixel aperture; edges of a projection of the first type of pixel aperture on the substrate being curves, and the edges being not parallel to each other.

19 Claims, 18 Drawing Sheets

(58) Field of Classification Search
CPC ............. H01L 27/3216; H01L 27/3248; H01L 27/3276; H01L 51/52; H01L 51/5209; H01L 51/5225
See application file for complete search history.

(56) References Cited

U.S. PATENT DOCUMENTS

| | | |
|---|---|---|
| 2003/0122486 A1 | 7/2003 | Yabe |
| 2006/0170111 A1 | 8/2006 | Isa et al. |
| 2008/0224594 A1 | 9/2008 | Takagi et al. |
| 2009/0085854 A1 | 4/2009 | Kunimori et al. |
| 2016/0104750 A1* | 4/2016 | Jinta .................. H01L 27/3216 257/40 |
| 2016/0372709 A1 | 12/2016 | Lee et al. |
| 2017/0256747 A1 | 9/2017 | Lee et al. |
| 2018/0219058 A1 | 8/2018 | Xiang et al. |
| 2019/0013363 A1 | 1/2019 | Joo et al. |
| 2019/0074471 A1* | 3/2019 | Abe .................. H01L 51/5209 |
| 2019/0221621 A1 | 7/2019 | Cui |

FOREIGN PATENT DOCUMENTS

| | | |
|---|---|---|
| CN | 107154417 A | 9/2017 |
| CN | 108010947 A | 5/2018 |
| CN | 108075045 A | 5/2018 |
| CN | 108231856 A | 6/2018 |
| CN | 109216415 A | 1/2019 |
| CN | 208608202 U | 3/2019 |
| JP | 2005203215 A | 7/2005 |
| JP | 2006237586 A | 9/2006 |
| JP | 2007103032 A | 4/2007 |
| JP | 2009065498 A | 3/2009 |
| JP | 2009099378 A | 5/2009 |
| KR | 1020090032977 A | 4/2009 |
| KR | 1020150033160 A | 4/2015 |
| KR | 20160054720 A | 5/2016 |
| TW | 201133314 A | 10/2011 |
| TW | 201624689 A | 7/2016 |
| WO | 2013038970 A1 | 3/2013 |
| WO | 2017195560 A1 | 11/2017 |

OTHER PUBLICATIONS

International Search Report dated Apr. 1, 2019 in the corresponding International application(application No. PCT/CN2019/073267).
TW First Office Action with search report dated Jan. 9, 2020 in the corresponding TW application(application No. 108105383).
Office Action of Chinese Patent Application No. 201810886049.X dated Jul. 14, 2020.
Korean Office Action dated Sep. 7, 2021 in corresponding KR Application NO. 10-2020-7017734.
Japanese Office Action dated Aug. 19, 2021 in corresponding KR Application No. 2020-532905.
Extended European Search Report dated Jan. 29, 2021 in corresponding EP Application No. 19846530.4.

* cited by examiner

DISPLAY PANELS, DISPLAY SCREENS, AND DISPLAY TERMINALS

CROSS-REFERENCES TO RELATED APPLICATIONS

This application is a continuation application of International Application PCT/CN2019/073267, filed on Jan. 25, 2019, which claims priority to Chinese Patent Application No. 201810886049. X, filed on Aug. 6, 2018, entitled "DISPLAY PANEL, DISPLAY SCREEN, AND DISPLAY TERMINAL", the disclosure of both applications hereby incorporated by reference in their entirety.

TECHNICAL FIELD

The present disclosure relates to the field of display technologies.

BACKGROUND

With the rapid development of display terminals, the demand of users for screen-to-body ratio becomes increasingly higher, so that display terminals with full-screen displays are attracting more and more attention in the industry. As conventional display terminals, such as mobile phones, tablet PC and the like, require to integrate components such as a front-facing camera, an earphone, and an infrared sensing element and the like, the full-screen display of the display terminal can be achieved by providing a notched area on the display screen and configuring a transparent display screen in the notched area.

SUMMARY

According to various embodiments, a display panel, a display screen, and a display terminal are provided.

A display panel comprises a substrate and a pixel definition layer formed on the substrate. Pixel apertures are formed on the pixel definition layer, and the pixel apertures comprise a first type of pixel aperture. Each edge of a projection of the first type of pixel aperture on the substrate is a curve, and the edges are not parallel to each other.

A display screen comprises a first display area configured to display a dynamic or static picture, and further comprises the display panel as described above disposed in the first display area.

A display terminal comprises a device body and the display screen as described above. The device body has a device area, and the display screen covers the device body. The device area is located under the first display area, and photosensitive devices are disposed in the device area.

The details of one or more embodiments are set forth in the accompanying drawings and the description below. Other features, objects, and advantages of the invention will be apparent from the description and drawings, and from the claims.

BRIEF DESCRIPTION OF THE DRAWINGS

In order to illustrate the technical solutions of the embodiments of the present disclosure or the prior art more clearly, accompany drawings for describing the embodiments or the prior art are introduced briefly in the following. Apparently, the accompanying drawings in the following description are only some embodiments of the present disclosure, and persons of ordinary skill in the art can derive accompany drawings of the other embodiments from these accompanying drawings without any creative efforts.

DETAILED DESCRIPTION OF THE INVENTION

Reference will be made to the accompanying drawings and embodiments to describe the present disclosure in detail, so that the objects, technical solutions and advantages of the present disclosure can be more apparent and understandable.

It is understood that the specific embodiments described herein are merely illustrative of the present disclosure and are not intended to limit the present disclosure.

In the description of the present disclosure, it is to be understood that orientation or position relationships that are indicated by the terms "center", "transverse", "on", "under", "left", "right", "vertical", "horizontal", "top", "bottom", "inside", and "outside", and the like are orientation or position relationships shown based on the accompany drawings, and are merely for convenience of the description of the present disclosure and simplifying description, rather than indicating or implying that the indicated device or element must have a particular orientation or being constructed and operated in a particular orientation, and are therefore not to be construed as limitation of the present disclosure. Furthermore, it should be noted that when an element is referred to as "formed on another element," it can be directly connected to the other element or a mediating element may be present at the same time. When an element is considered to be "connected" to another element, it can be directly connected to the other element or a mediating element may be present at the same time. Instead, when an element is referred to as being "directly on" another element, there is no intermediate element.

Applicants have found that when a photosensitive device such as a camera or the like is placed under a transparent display panel, the captured photos are blurred. Applicant's research have found that this problem is due to the presence of the conductive traces in the body of the display screen of the electronic devices. The external light going through these conductive traces complicates the diffraction intensity distribution, resulting in diffraction stripes, which would then affect the normal operation of the photosensitive device such as a camera or the like. For example, when the camera under the transparent display area is in operation, an obvious diffraction would occur after the external light goes through the wire material traces within the display screen, so that the picture captured by the camera is distorted.

Figure 1:
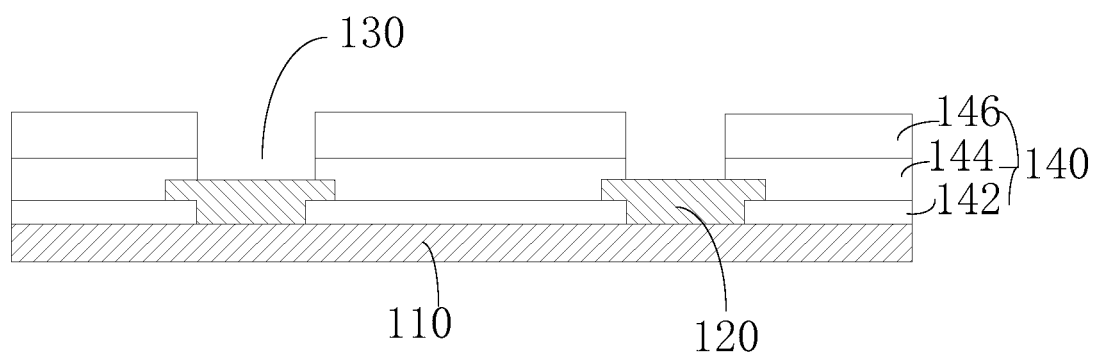
FIG. 1 is a cross-sectional view of a display panel in one embodiment.

In order to solve the above problem, one embodiment of the present disclosure provides a display panel. FIG. 1 is a cross-sectional view of the display panel in one embodiment. This display panel comprises a substrate 110 and a pixel definition layer 120 formed on the substrate 110. Pixel apertures 130 are formed on the pixel definition layer 120 to define a light emitting area of pixels. The pixels mentioned in this embodiment are all the smallest pixel units, such as sub-pixels.

The pixel apertures 130 comprise a first type of pixel aperture. The edges of a projection of the first type of pixel aperture on the substrate are not parallel to each other and each edge is a curve. In other words, the first type of pixel aperture has a changing width in each direction and there are different diffraction diffusion directions at the same position. When going through an obstacle such as a slit, a small hole, or a disk, the light will have different degrees of bend-divergence propagation, thus deviating from the original rectilinear propagation. This phenomenon is called diffraction. In diffraction process, the distribution of diffraction stripes is affected by the size of the obstacle, such as the width of the slit, the size of the small hole, and the like. The positions of diffraction stripes generated at positions with the same width are the same, so that a relatively obvious diffraction effect is generated. In this embodiment, when external light goes through this first type of pixel aperture, diffraction stripes having different positions and diffusion directions can be generated at positions with different widths, so that no obvious diffraction effect is generated, thereby ensuring that photosensitive elements disposed under this display panel can work properly.

The pixel apertures on the conventional pixel definition layer are each configured to be a rectangle or a square according to the pixel size. A rectangle has two sets of mutually parallel edges, and distances between two long edges are equal everywhere, and distances between two short edges are also equal everywhere. Therefore, when external light goes through this pixel aperture, diffraction stripes having the same position and uniform diffusion direction are generated at different positions in the direction of long edge or in the direction of short edge, thereby generating an obvious diffraction effect, so that photosensitive elements located under this display panel cannot work properly. The display panel according to the present embodiment can solve this problem well, ensuring that photosensitive elements under the display panel can work normally.

Optionally, the substrate 110 may be a transparent substrate such as a glass substrate, a quartz substrate, or a plastic substrate.

Optionally, a curve adopted in each edge of a projection of the first type of pixel apertures on the substrate 110 may be at least one of a circle, an ellipse, and other curves having changing curvatures.

Optionally, the projection of the first type of pixel aperture on the substrate 110 is a pattern unit or a plurality of pattern units connected to each other. This pattern unit can be a circle or an ellipse. The pattern unit can also be composed of curves having different radii of curvature elsewhere. The number of pattern unit can be determined according to the shape of a corresponding sub-pixel. For example, the number can be determined according to an aspect ratio of a sub-pixel. The aperture ratio of the pixel should be considered while determining the number of pattern unit. Optionally, the pattern unit may also be an axisymmetric structure, thus ensuring that each pixel on the entire display panel has a uniform aperture ratio without affecting final display effect.

When the projection of the first type of pixel aperture on the substrate 110 has at least two pattern units, the projection further comprises a first connecting portion. At least two of the pattern units are connected to each other by the first connecting portion, thus forming a pattern area that is integrally connected. Each edge of the first connecting portion may be composed of at least one of a curve line and a straight line. When each edge of the first connecting portion is a straight line, the first connecting portion has a strip shape. Optionally, each edge of the first connecting portion is composed of curves, so that light can also diffuse in different directions at the position of the connecting unit, thus reducing the diffraction effect.

Figure 2:
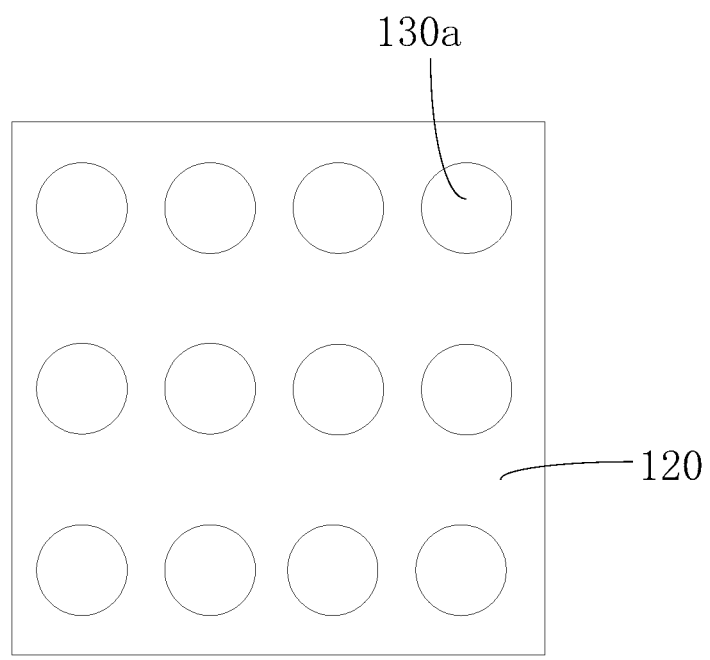
FIG. 2 is a schematic view of a projection of a pixel definition layer on a substrate in one embodiment.

FIG. 2 is a schematic view of the projection of the pixel definition layer 120 on the substrate 110 in one embodiment. In this embodiment, the pixel apertures 130 on the pixel definition layer 120 are all of first type of pixel apertures. A plurality of first type of pixel apertures are regularly arranged on the substrate 110 in an array. Each edge of the projection 130a of the first type of pixel aperture on the substrate 110 is a curve, i.e., each edge of the first type of pixel aperture is a curve. Therefore, when light goes through the first type of pixel apertures, the generated diffraction stripes do not diffuse in only one direction, so that the diffraction is not obvious and a better diffraction improvement effect is obtained. Specifically, the projection 130a (hereinafter referred to as projection 130a) of each first type of pixel aperture on the substrate 110 is a circle or a pattern with at least two circles connected to each other. The number of circles included in the projection 130a may be determined according to the shape of the corresponding sub-pixel.

Referring to FIG. 2, in this embodiment, the shape of the sub-pixel corresponding to the first type of the pixel aperture 130 is a rectangle having an aspect ratio less than 1.5, or a square, that is, when the aspect ratio of the shape of the sub-pixel corresponding to the first type of the pixel aperture 130 is less than 1.5, the projection 130a is a circle. Optionally, the projection 130a is an axisymmetric pattern, whose symmetry axis corresponds to the symmetry axis of the corresponding sub-pixel. A diameter of the circle in projection 130a is less than the minimum width of the sub-pixel. Specifically, the diameter of the circle of the projection 130a may be determined according to the shape of the sub-pixel as well as the aperture ratio. The diameter of the circle of the projection 130a may be determined according to a conventional method of determining the size of the pixel aperture, which will not be described herein.

Figure 3:
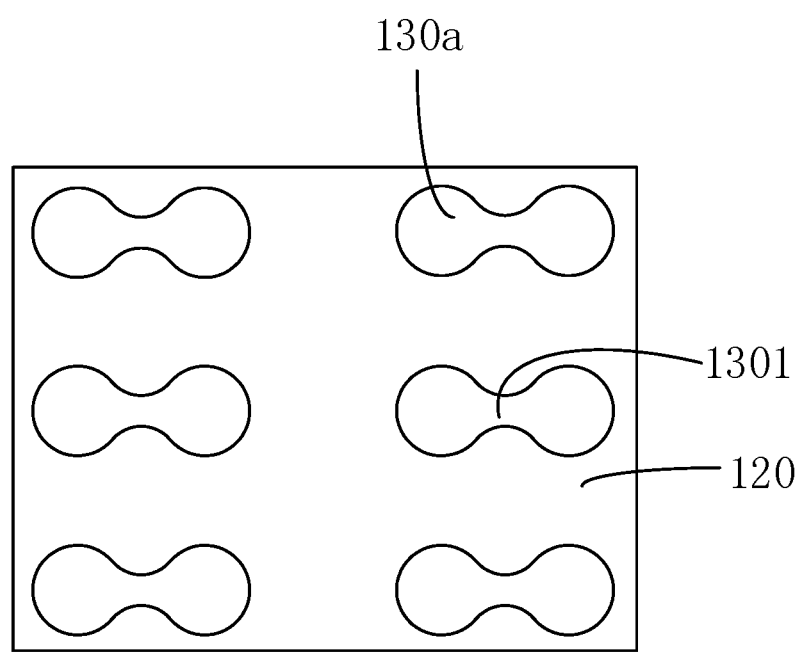
FIG. 3 is a schematic view of a projection of a pixel definition layer on a substrate in another embodiment, with different shape from that of the projection of a pixel definition layer of FIG. 2.

FIG. 3 is a schematic view of a projection of the pixel definition layer 120 on the substrate 110 in another embodiment. In this embodiment, the pixel apertures 130 are also all of the first type of pixel apertures, and all of the first type of pixel apertures are regularly arranged on the substrate 110. In this embodiment, the aspect ratio of the pixel corresponding to the first type of pixel aperture is between 1.5 and 2.5. At this time, the projection 130a has a dumbbell shape formed by two circles connected to each other. The two circles are respectively arranged along a length direction of the corresponding sub-pixel. Optionally, a first connecting portion 1301 is provided between the two circles, and both edges of the first connecting portion 1301 are curves, thereby ensuring that the light can diffuse in various directions when going through the first connecting portion 1301, thus improving the diffraction effect.

Figure 4:
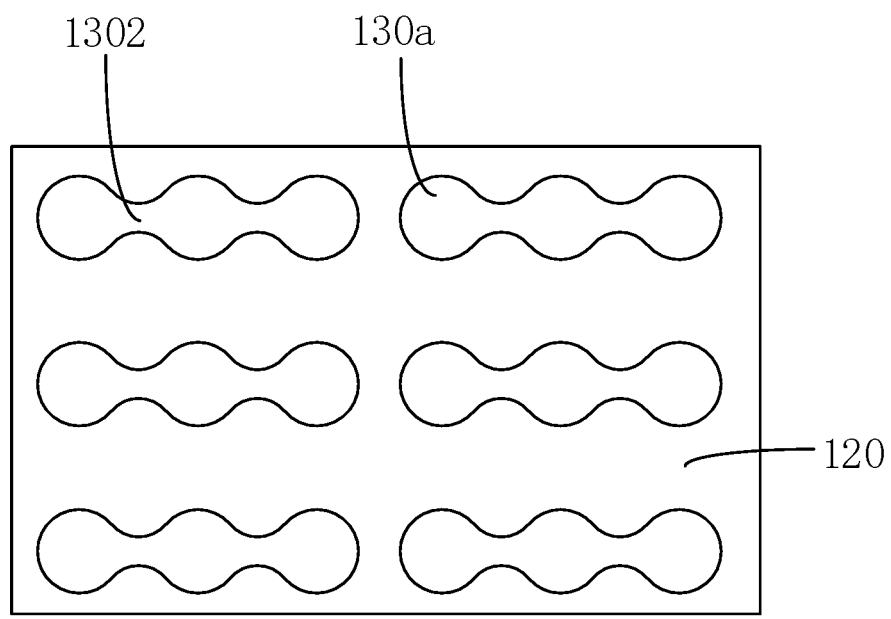
FIG. 4 is a schematic view of a projection of a pixel definition layer on a substrate in another embodiment, with different shape from that of the projection of a pixel definition layer of FIG. 2.

FIG. 4 is a schematic view of a projection of the pixel definition layer 120 on the substrate 110 in one embodiment. In this embodiment, the pixel apertures 130 are also all of the first type of pixel apertures, and all of the first type of pixel apertures are regularly arranged on the substrate 110. In this embodiment, the aspect ratio of the sub-pixel corresponding to the first type of pixel aperture is greater than 2.5. At this time, the projection 130a is of a wave shape formed by three or more circles connected to each other. The three or more circles are respectively arranged along a length direction of the corresponding sub-pixel. Optionally, a first connecting portion 1302 is also formed in the projection 130a. The first connecting portion 1302 is an arc line, that is, intersections of the three or more circles are connected by arc lines, thereby ensuring that the light can diffuse in various directions when going through the first connecting portion 1302, thus improving the diffraction effect.

When the aspect ratio of the sub-pixel corresponding to the first type of pixel aperture is equal to 1.5, the projection 130a may be a circle, or may be a dumbbell shape in which two circles are connected to each other. When the aspect ratio of the sub-pixel corresponding to the first type of pixel aperture is equal to 2.5, the projection 130a may be a dumbbell shape in which two circles are connected to each other, or may be a wave shape in which three circles are connected to each other.

Figure 5:
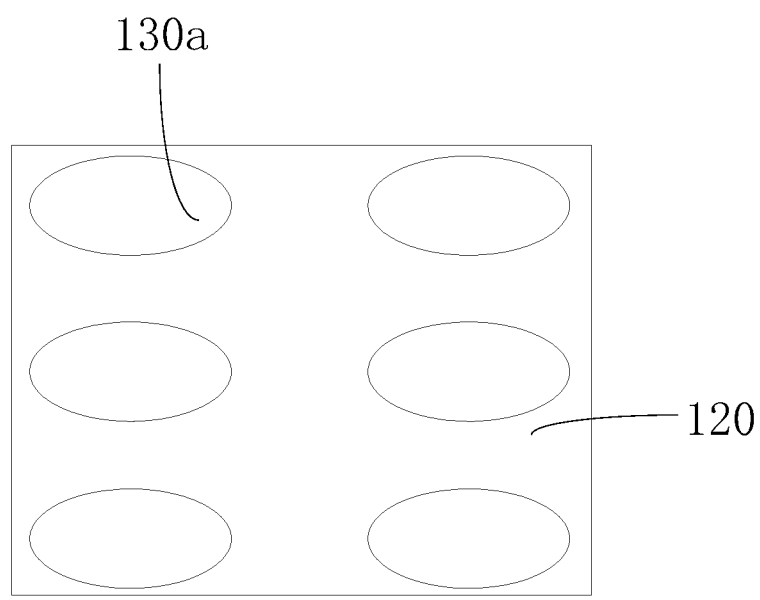
FIG. 5 is a schematic view of a projection of a pixel definition layer on a substrate in still another embodiment, with different shape from that of the projection of a pixel definition layer of FIG. 2.

FIG. 5 is a schematic view of a projection of the pixel definition layer 120 on the substrate 110 in one embodiment. In this embodiment, the pixel apertures 130 are also all of the first type of pixel apertures, and all of the first type of pixel apertures are regularly arranged on the substrate 110. Referring to FIG. 5, the projection 130a is an ellipse. At this time, the size of the ellipse matches the size of the sub-pixel. For example, if the dimension aspect ratio of the sub-pixel is 1.2, a ratio of the major axis of the ellipse to the minor axis of the ellipse is 1.2. Optionally, a center point of the ellipse corresponds to a center point of the corresponding sub-pixel. In other embodiments, when the aspect ratio of the sub-pixel corresponding to the first type of pixel aperture is relatively large, the projection 130a may also be a wave shape in which two or more ellipses are connected.

As can be clearly seen from FIG. 2 to FIG. 5, the projection 130a has a changing width in each direction, that is, the first type of pixel aperture has a changing width in each direction, so that when the light goes through, diffraction stripes having different positions are generated at different width positions, thus reducing the diffraction effect.

Figure 6:
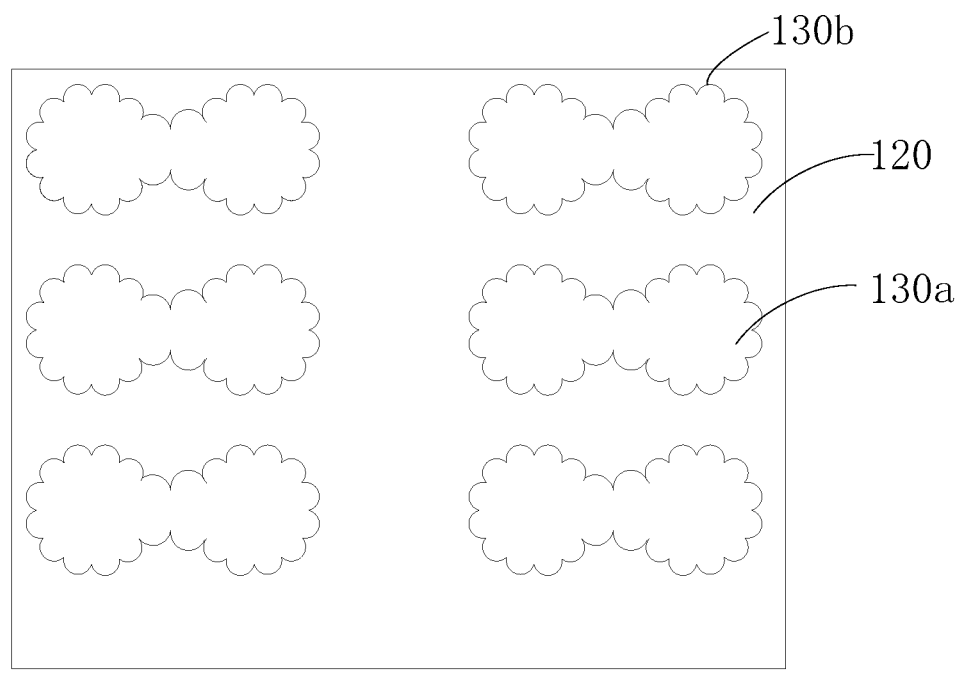
FIG. 6 is a schematic view of a projection of a pixel definition layer on a substrate in still another embodiment, with different shape from that of the projection of a pixel definition layer of FIG. 2.

Optionally, a plurality of protrusions 130b are formed on the projection 130a, as shown in FIG. 6. The plurality of protrusions 130b are arranged along an edge of the projection 130a. The edges of the protrusions 130b are all curves. As the pixel definition layer 120 is used to define the shape of the sub-pixel, the sub-pixel finally obtained also has a plurality of protrusions, and the plurality of protrusions are arranged along the edge of the sub-pixel. The uniformity distribution of widths at each position of a sub-pixel can be further disturbed by configuring the plurality of protrusions 130b on the sub-pixel, thereby reducing the diffraction effect.

Figure 7:
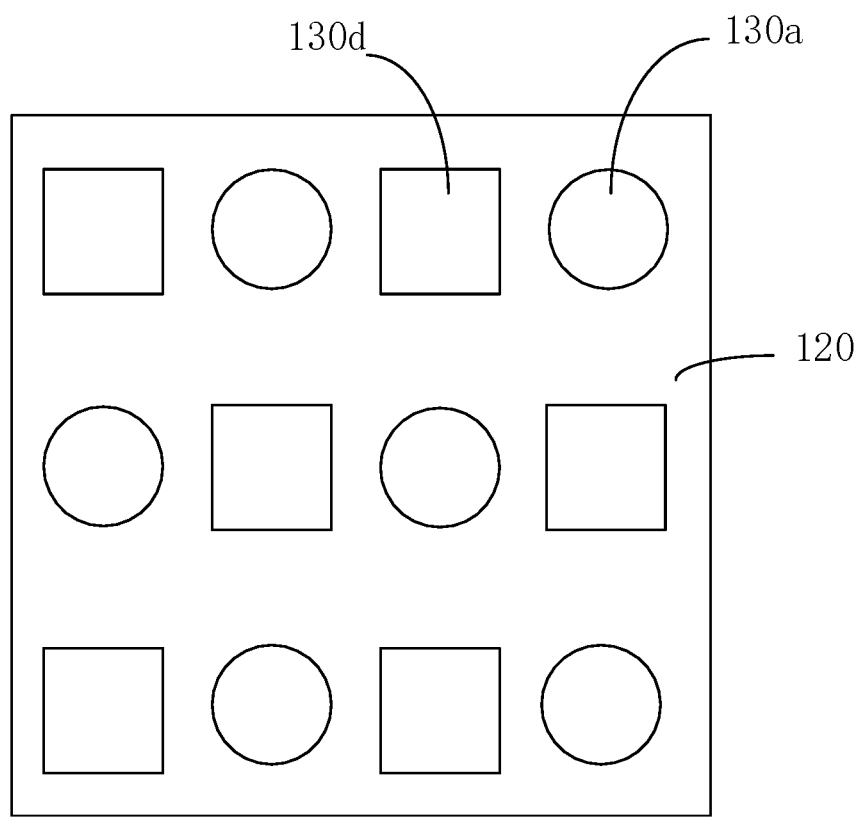
FIG. 7 is a schematic view of a projection of a pixel definition layer on a substrate in another embodiment, with different shape from that of the projection of a pixel definition layer of FIG. 2.

Optionally, the pixel aperture 130 may further comprise a second type of pixel aperture, in that case the projection of the pixel definition layer 120 on the substrate 110 is as shown in FIG. 7. The projection of the second type of pixel aperture on the substrate 110 is 130d, which has the same shape as the sub-pixel. In this embodiment, the sub-pixel is a square in shape, thus the projection 130d is also a square, so that the pixel aperture ratio can be increased to some extent. The projection 130a and the projection 130d are regularly arranged on the substrate 110, and the two are distributed alternatively, that is, the first type of pixel aperture and the second type of pixel aperture are uniformly and regularly arranged, so that the diffraction effect at each position of the entire display panel is more consistent.

Optionally, each pixel aperture 130 in the pixel definition layer 120 comprises the first type of pixel aperture and the second type of pixel aperture. Each edge of the first type of pixel aperture and the second type of pixel aperture is a non-smooth edge. A plurality of protrusions are formed on the non-smooth edge, and edges of the protrusions are straight lines and/or curve lines. The uniformity distribution of widths at each position of the pixel aperture can be further disturbed by configuring each edge of the pixel aperture 122a as the non-smooth edge, thereby reducing the diffraction effect.

Figure 8:
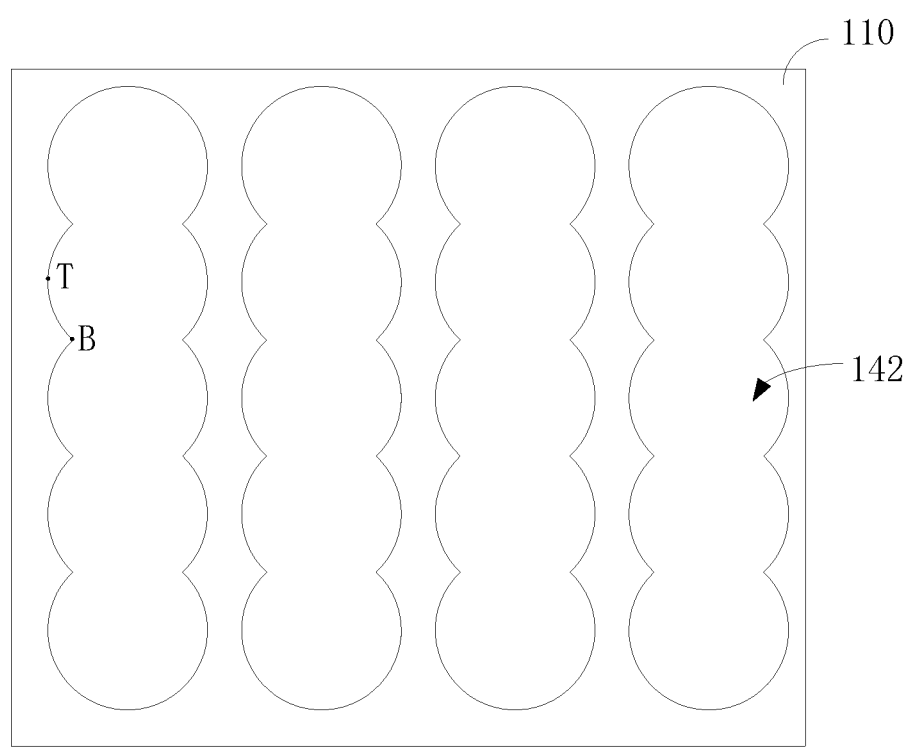
FIG. 8 is a schematic view of a first electrode of a display panel which is a PMOLED display panel in one embodiment.

Optionally, the display panel further comprises a light emitting structure 140 formed in the light emitting area. The pixel definition layer 120 is formed between two adjacent light emitting structures 140. The light emitting structure 140 comprises a plurality of wave-shaped first electrodes 142 formed on the substrate 110. FIG. 8 is a schematic view of the plurality of the first electrodes 142. At this time, the display panel is a Passive-Matrix Organic Light-Emitting Diode (PMOLED) display panel. In this embodiment, as the first electrode 142 is wavy in shape, the width thereof continuously changes or intermittently changes in the extending direction of the first electrode 142. The continuous change of width means that widths at any two adjacent positions of the first electrode 142 are different. In FIG. 8, the extending direction of the first electrode 142 is a length direction thereof. The first electrode 142 continuously changes in width in the extending direction. The intermittent change of width means that, there are some areas in the first electrode 142 where the widths of two adjacent positions are the same, while there are some areas where the widths of two adjacent positions are different. In this embodiment, the plurality of the first electrodes 142 are regularly arranged on the substrate 110, therefore, gaps between two adjacent first electrodes 142 also present a continuous change or intermittent change in an extending direction parallel to the first electrode 142. The first electrode 142 may periodically changes in the extending direction regardless of whether the width thereof continuously changes or intermittently changes, and the length of one change period may correspond to the width of one pixel.

Figure 9:
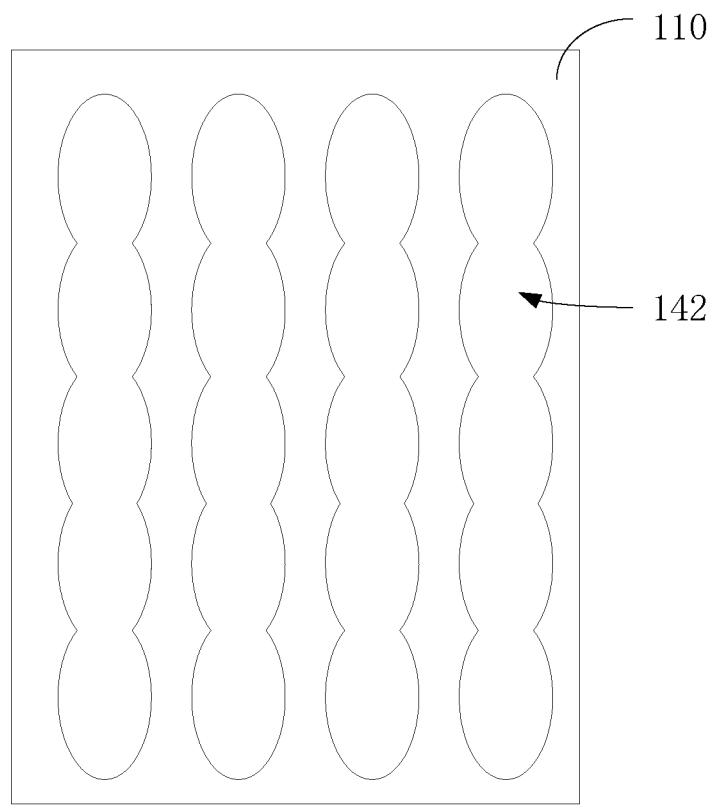
FIG. 9 is a schematic view of a first electrode of a display panel which is a PMOLED display panel in another embodiment, with different shape from that of a first electrode of a display panel of FIG. 8.

Optionally, both edges of the first electrode 142 in the extending direction are wavy, as shown in FIG. 8. The crests T of the two edges in the extending direction are oppositely disposed and the troughs B of the two edges in the extending direction are oppositely disposed. In this embodiment, the two edges are connected by the same arc-shaped edge. In other embodiments, the two edges may also be connected by the same elliptical edge, as shown in FIG. 9. By configuring both edges of the first electrode 142 as waves formed by circular arcs or ellipses, it can be ensured that the diffraction stripes generated on the first electrode 142 can diffuse to different directions, so as to avoid a more obvious generated diffraction effect.

Figure 10:
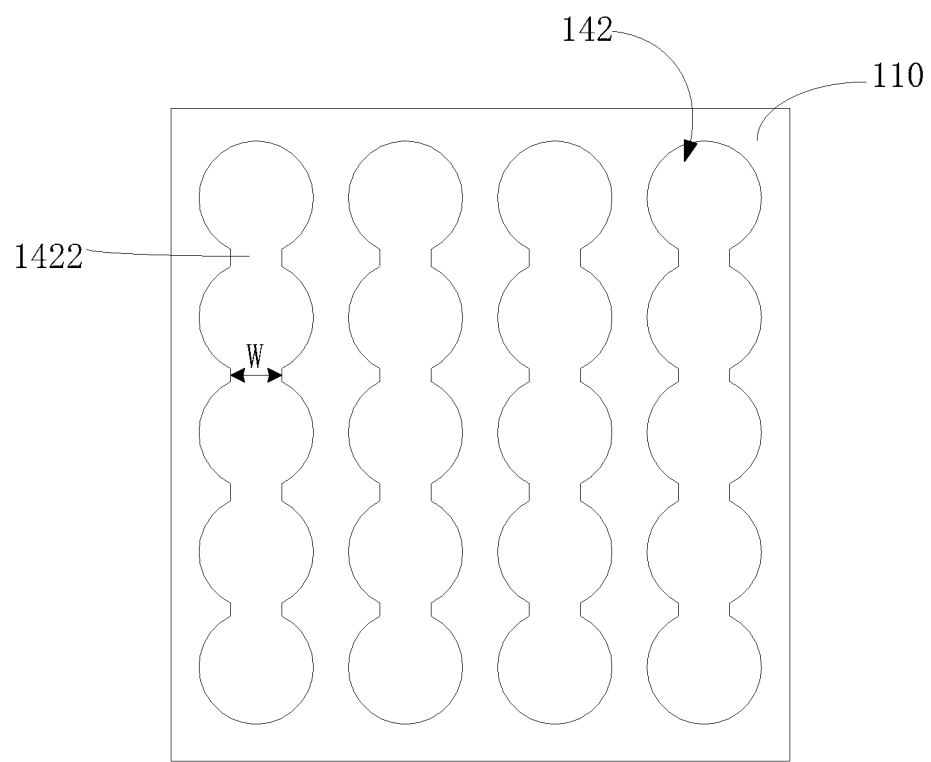
FIG. 10 is a schematic view of a first electrode of a display panel which is a PMOLED display panel in yet another embodiment, with different shape from that of a first electrode of a display panel of FIG. 8.

Optionally, a second connecting portion 1422 is formed at a position corresponding to the troughs of the first electrode 142, as shown in FIG. 10. The second connecting portion 1422 has a strip shape. The width W of the second connecting portion 1422 should be greater than 4 microns and less than the maximum width of the first electrode 142. Optionally, an area between two adjacent second connecting portions 1422 on the first electrode 142 corresponds to one pixel aperture, and the second connecting portion 1422 corresponds to a gap between two adjacent pixel apertures. By adjusting the width W of the second connecting portion 1422, the adjustment of the magnitude of the resistance of the first electrode 142 can be achieved, so that the resistance of the first electrode 142 satisfies the use requirement. In other embodiments, the second connecting portion 1422 may also adopt other irregular structures, such as a shape with small middle portion and two large end portions, or adopt a shape with large middle portion and two small end portions.

Figure 11:
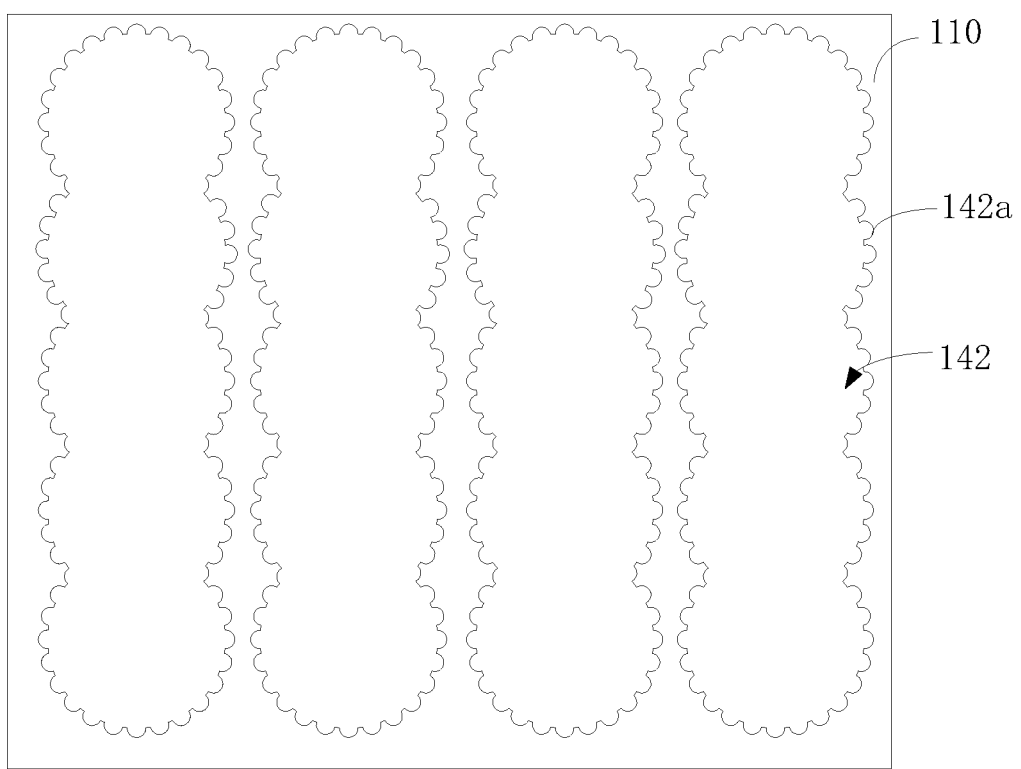
FIG. 11 is a schematic view of a first electrode of a display panel which is a PMOLED display panel in still another embodiment, with different shape from that of a first electrode of a display panel of FIG. 8.

Optionally, a plurality of protrusions 142*a* are formed on the first electrode 142, as shown in FIG. 11. The edges of the plurality of protrusions 142*a* are curves. The uniformity distribution of widths at each position of the first electrode 120 can be further disturbed by configuring the plurality of 142*a* on the first electrode 142, thus reducing the diffraction effect.

Optionally, the light emitting structure 140 further comprises a light emitting layer 144 and a second electrode 146, which are formed on the first electrode 142, as shown in FIG. 1. The first electrode 142 is an anode and the second electrode 146 is a cathode. In other embodiments, the first electrode 142 is a cathode and the second electrode 146 is an anode. The extending direction of the second electrode 146 and the extending direction of the first electrode 142 are perpendicular to each other. The second electrode 146 may have the same shape as the first electrode 142, and each adopts a wavy electrode structure.

Figure 12:
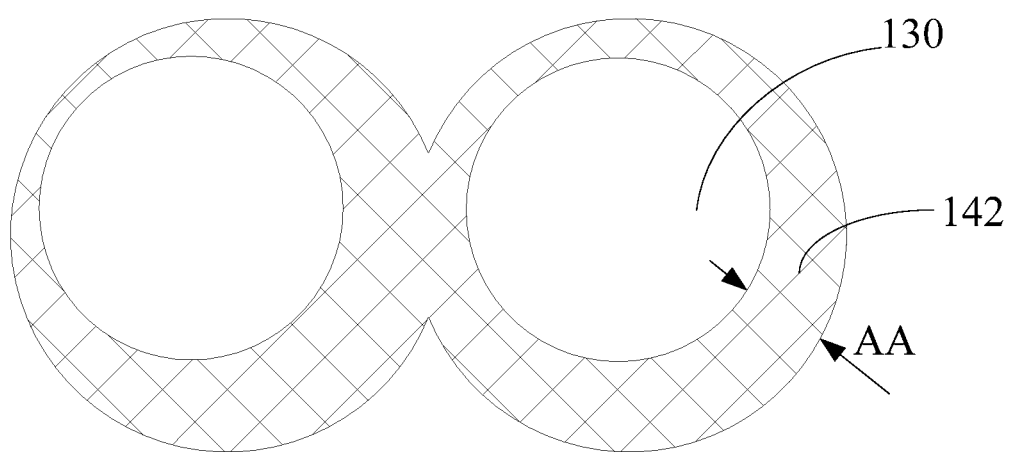
FIG. 12 is a schematic view of a projection of a first electrode and pixel apertures in a display panel on a substrate in one embodiment.

Optionally, an edge of the projection of the first electrode 142 on the substrate 110 and an edge of the projection of the pixel aperture 130 on the substrate 110 are not parallel to each other. As shown in FIG. 12, at different positions, intervals AA of the two in corresponding area are different, so that the diffraction stripes generated at the positions having different intervals also have different positions, and finally the diffraction effect can be reduced, thereby ensuring that when a camera is provided under this transparent display panel, the captured photo has a higher resolution.

Optionally, the display panel is an Active Matrix Organic Light-Emitting Diode (AMOLED) display panel. At this time, the substrate 110 is a Thin Film Transistor (TFT) array substrate. The first electrode is formed on the substrate 110. The first electrode comprises various conductive traces formed on the TFT array substrate. The width dimension of the first electrode should be designed according to the width of the conductive trace. The conductive traces comprise at least one of a scanning wire, a data wire, and a power wire. For example, all conductive traces on the TFT array substrate, such as a scanning wire, a data wire, and a power wire can be modified to adopt a shape of an electrode as shown in FIG. 8. By changing the conductive traces on the TFT array substrate to any of the shapes of wavy electrode of FIGS. 8 to 11, it can be ensured that, in an extending direction of the conductive traces, when light goes through different width positions and different gaps at adjacent wire traces, diffraction stripes having different positions can be generated, thereby reducing the diffraction effect, so that the photosensitive device placed under it can work normally.

Figure 13:
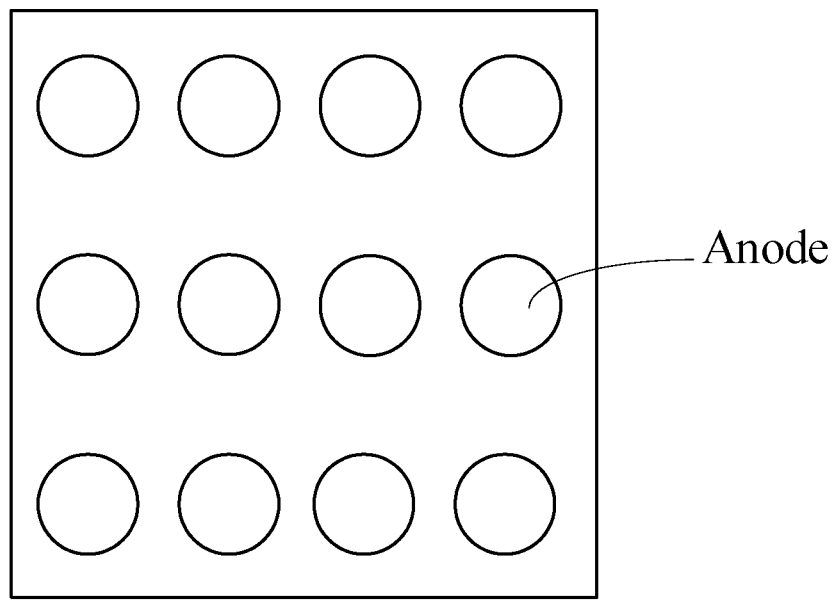
FIG. 13 is a schematic view of an anode of a display panel which is an AMOLED display panel in one embodiment.
Figure 14:
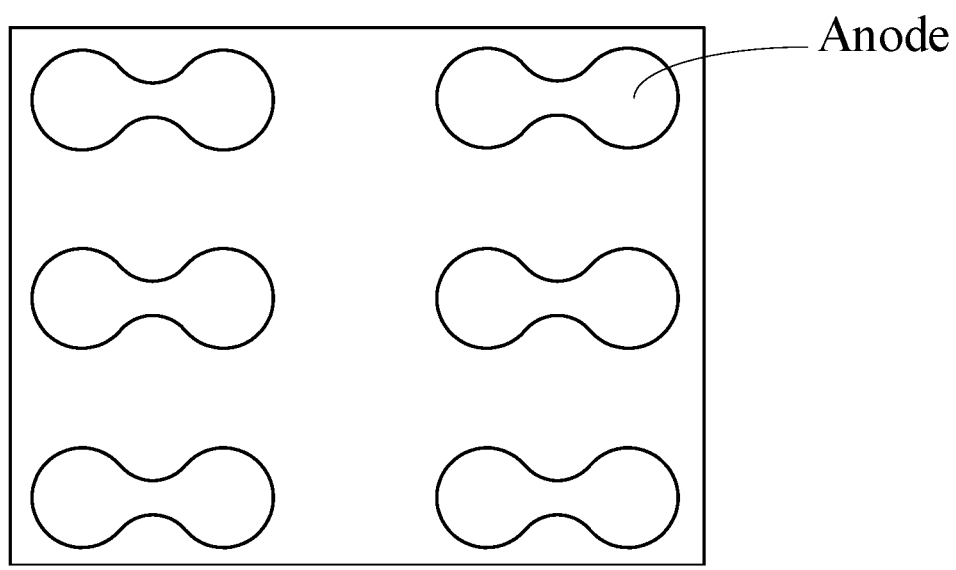
FIG. 14 is a schematic view of an anode of a display panel which is an AMOLED display panel in another embodiment, with different shape from that of an anode of a display panel of FIG. 13.

Optionally, when the display panel is an AMOLED display panel, the display panel further comprises an anode layer formed on the substrate. The anode layer comprises an anode array. The anode array is composed of a plurality of mutually independent anodes. The anode may be circular, elliptical or dumbbell formed by two circles connected to each other in shape. FIG. 13 is a schematic view of the anode array formed by circular anodes, and FIG. 14 is a schematic view of the anode array formed by dumbbell shaped anodes. By changing the anode to be circular, elliptical or dumbbell in shape, it can be ensured that when light goes through the anode layer, diffraction stripes having different positions and diffusion directions can be generated at different width positions of the anode, thereby reducing the diffraction effect. Further, each sub-pixel may also be arranged to be circular, elliptical or dumbbell in shape as shown in FIG. 13 and FIG. 14 to reduce the diffraction effect.

Figure 15:
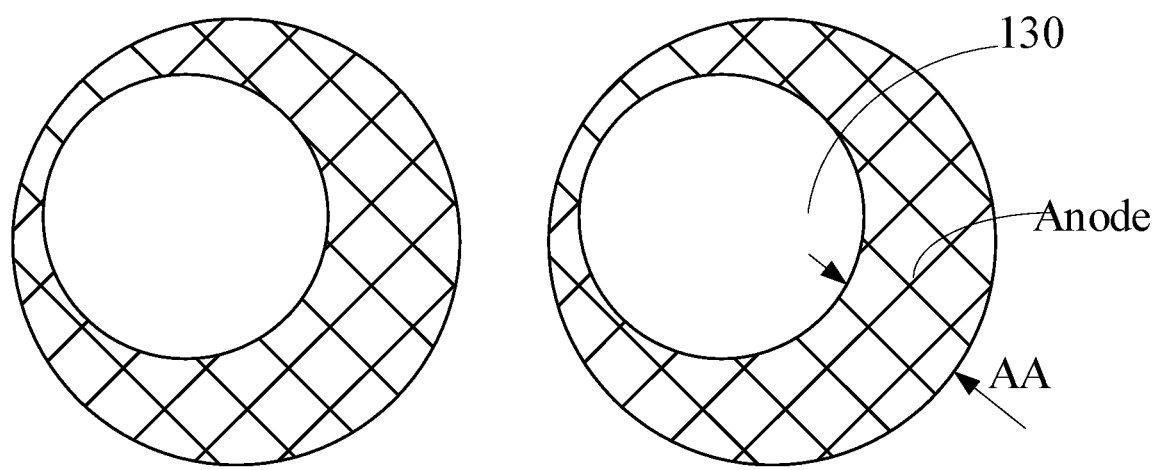
FIG. 15 is a schematic view of a projection of an anode and a pixel aperture in a display panel on a substrate in one embodiment.

Optionally, an edge of the projection of the anode on the substrate 110 and the edge of the projection of the pixel aperture 130 on the substrate 110 are not parallel to each other. As shown in FIG. 15, at different positions, intervals AA of the two in corresponding area are different, so that the diffraction stripes generated at the position area having different intervals also have different positions. The diffraction at different positions cancel each other, and finally the diffraction can be reduced, thereby ensuring that when a camera is placed under this transparent display panel, the captured photo has a higher definition.

Optionally, the above-mentioned display panel may also be a LCD display panel.

Optionally, the above-mentioned display panel may be a transparent or transflective display panel. The transparency of the display panel can be achieved by using materials of each layer having good a light transmittance. For example, each layer uses a material having a light transmittance of more than 90%, so that the light transmittance of the entire display panel can be more than 70%. Optionally, each layer uses a material having a light transmittance greater than 95%, so that the light transmittance of the entire display panel is above 80%. Specifically, the material of the conductive traces such as the cathode and the anode may be ITO, IZO, Ag+ITO or Ag+IZO, etc., the material of the insulating layer is preferably $SiO_2$, $SiN_x$ and $Al_2O_3$, etc., and the material of the pixel definition layer 120 is a highly transparent material. The transparency of the display panel can also be achieved by other technical means, and structures of the above-mentioned display panels can be applied. The transparent or transflective display panel can display normally when it is in working state. The transparent or transflective display panel is in a non-displayed state when it is not working. When the display panel is in a non-displayed state, its panel is in a transparent or translucent state. At this time, the photosensitive device and the like placed under this display panel can be seen through this display panel.

One embodiment of the present disclosure also provides a display screen. The display screen has a first display area for displaying a dynamic or static picture. The first display area is provided with a display panel as mentioned in any of the foregoing embodiments. A photosensitive device may be placed under the first display area. As the first display area adopts the display panel in the foregoing embodiments, when light goes through this display area, no obvious diffraction effect is generated, so that the photosensitive device located under the first display area can be ensured to work normally. When the photosensitive device is not working, the first display area is changed as the display content of the entire display screen changes, such as displaying the external photo being captured. Alternatively, the first display area may also be in a non-display state, so as to further ensure that the photosensitive device can perform light collection normally through this display panel.

Figure 16:
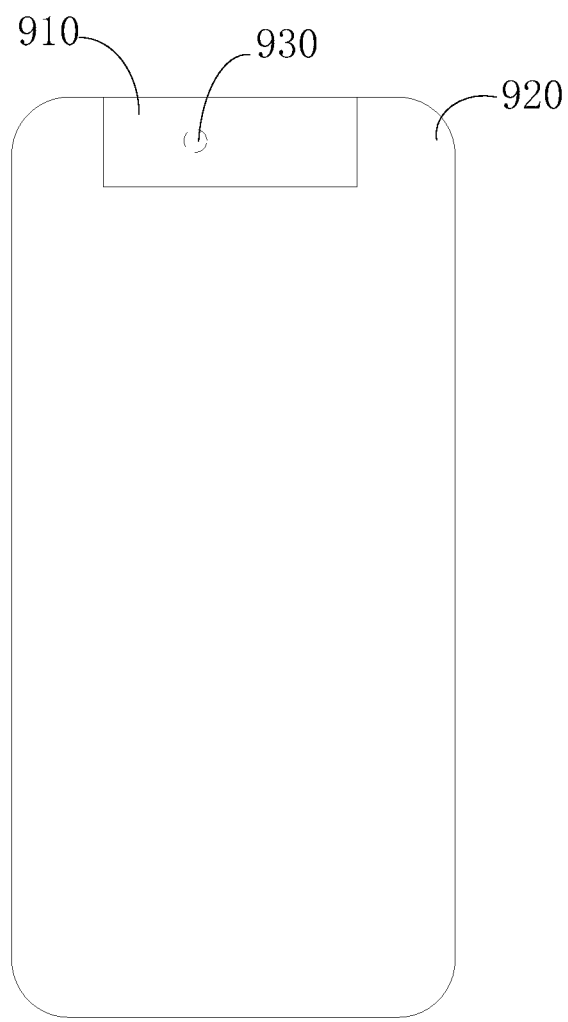
FIG. 16 is a schematic view of a display screen in one embodiment.

FIG. 16 is a schematic view of the display screen in one embodiment. This display screen comprises a first display area 910 and a second display area 920, and the second display area 920 is adjacent to the first display area 910. The light transmittance of the first display area 910 is greater than the light transmittance of the second display area 920. A photosensitive device 930 may be placed under the first display area 910. The first display area 910 is provided with a display panel as mentioned in any of the foregoing embodiments. The first display area 910 and the second display area 920 both serve to display static or dynamic pictures. As the first display area 910 adopts the display panel in the foregoing embodiments, when light goes through this display area, no significant diffraction effect is generated, so that the photosensitive device 930 located under the first display area 910 can be ensured to work normally. The first display area 910 may display dynamic or static pictures normally when the photosensitive device 930 is not working. The first display area 910 can be in a non-display state when the photosensitive device 930 is working, thereby ensuring that the photosensitive device 930 can perform light collection normally through this display panel. In other embodiments, the light transmittance of the first display area 910 and the light transmittance of the second display area 920 may be the same, so that the entire display panel has better light transmittance uniformity, ensuring that the display panel has a good display effect.

Optionally, the display panel provided in the first display area 910 is a PMOLED display panel or an AMOLED display panel, and the display panel provided in the second display area 920 is an AMOLED display panel, thereby a full-screen composed of a PMOLED display panel and an AMOLED display panel may be formed.

Figure 17:
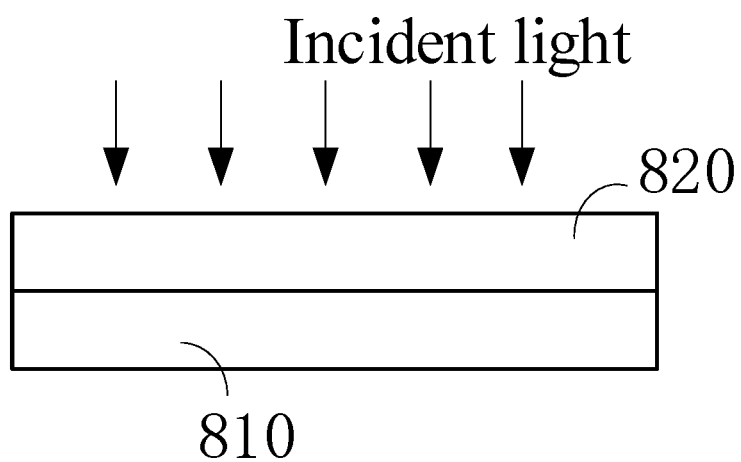
FIG. 17 is a schematic view of a display terminal in one embodiment.

Another embodiment of the present disclosure further provides a display terminal. FIG. 17 is a schematic view of the display terminal in one embodiment, and the display terminal comprises a device body 810 and a display screen 820. The display screen 820 is disposed on the device body 810 and is interconnected with the device body 810. Wherein the display screen 820 may adopt a display screen in any of the foregoing embodiments to display a static or dynamic picture.

Figure 18:
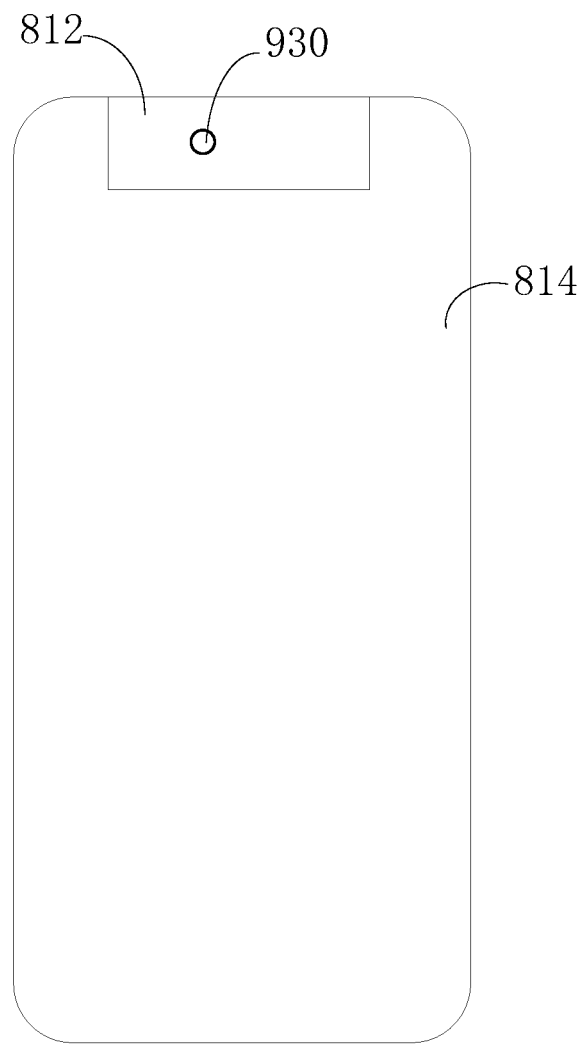
FIG. 18 is a schematic view of a device body in one embodiment.

FIG. 18 is a schematic view of the device body 810 in one embodiment. In this embodiment, the device body 810 may be provided with a notched area 812 and a non-notched area 814. Photosensitive devices such as a camera 930 and an optical sensor and the like may be provided in the notched area 812. At this time, the display panel of the first display area of the display screen 820 is attached to the notched area 812, so that the above-mentioned photosensitive devices such as the camera 930 and the optical sensor and the like can perform operations such as external light collection and the like through the first display area. Since the display panel in the first display area can effectively improve the diffraction phenomenon generated by the transmission of the external light through this first display area, thereby effectively improving the quality of the photo captured by the camera 930 on the display device, and avoiding the distortion of the captured photo due to the diffraction, while also improving accuracy and sensitivity of the optical sensor to sense the external light.

The above-mentioned electronic devices may be mobile phone, tablet PC, PDA, iPod and other digital devices.

The technical features of the above-described embodiments may be combined arbitrarily. To simplify the description, not all the possible combinations of the technical features in the above embodiments are described. However, all of the combinations of these technical features should be considered as within the scope of this disclosure, as long as such combinations do not contradict with each other.

The above embodiments merely illustrates several embodiments of the present disclosure, and the description thereof is specific and detailed, but it shall not be constructed as limiting the scope of the present disclosure. For a person of ordinary skill in the art, several variations and improvements may be made without departing from the concept of this disclosure, and these are all within the protection scope of this disclosure. Therefore, the protection scope of the present disclosure shall be subject to the appended claims.

The invention claimed is:

1. A display panel, comprising:
　a substrate;
　a pixel definition layer formed on the substrate, the pixel definition layer having a plurality of pixel apertures defined thereon, the plurality of pixel apertures comprising a first type of pixel aperture, and an edge of a projection of the first type of pixel aperture being a curve, and edges of a projection of the first type of pixel aperture being not parallel to each other; and
　a first electrode layer formed on the substrate, the first electrode layer comprising a plurality of mutually independent first electrodes, an edge of a projection of the first electrode on the substrate and an edge of a projection of the pixel aperture on the substrate being not parallel to each other.

2. The display panel according to claim 1, wherein the projection of the first type of pixel aperture on the substrate comprises a pattern unit or at least two pattern units connected to one another.

3. The display panel according to claim 2, wherein:
when an aspect ratio of a sub-pixel corresponding to the first type of pixel aperture is less than 1.5, the projection of the first type of pixel aperture on the substrate is a circle;
when an aspect ratio of a sub-pixel corresponding to the first type of pixel aperture is greater than or equal to 1.5 and less than or equal to 2.5, the projection of the first type of pixel aperture on the substrate is two circles connected to each other;
when an aspect ratio of a sub-pixel corresponding to the first type of pixel aperture is greater than 2.5, the projection of the first type of pixel aperture on the substrate is at least three circles connected to each other.

4. The display panel according to claim 2, wherein the projection of the first type of pixel aperture on the substrate is an ellipse, and a ratio of a major axis to a minor axis of the ellipse is equal to an aspect ratio of a sub-pixel corresponding to the first type of pixel aperture.

5. The display panel according to claim 2, wherein the projection of the first type of pixel aperture on the substrate is an axisymmetric pattern.

6. The display panel according to claim 2, wherein the projection of the first type of pixel aperture on the substrate further comprises a first connecting portion, and two pattern units being connected to each other through the first connecting portion, and at least one of two edges of the first connecting portion being a straight line or a curve line.

7. The display panel according to claim 1, wherein the pixel aperture defines a shape of a sub-pixel, a plurality of protrusions being formed on the sub-pixel, and the plurality of protrusions being distributed along an edge of the sub-pixel.

8. The display panel according to claim 1, wherein the pixel aperture further comprises a second type of pixel aperture; a projection of the second type of pixel aperture on the substrate being a rectangle; the first type of pixel aperture and the second type of pixel aperture being arranged alternatively on the substrate.

9. The display panel according to claim 1, wherein:
the display panel is a passive-matrix organic light-emitting diode display panel;
the plurality of first electrodes extends in parallel in the same direction, the adjacent first electrodes having an interval therebetween;
in an extending direction of the first electrode, a width of the first electrode continuously changes or intermittently changes, and the interval continuously changes or intermittently changes.

10. The display panel according to claim 9, wherein both edges of the first electrode in the extending direction are wavy, wrests of the two edges being oppositely disposed, and troughs of the two edges being oppositely disposed.

11. The display panel according to claim 10, wherein a second connecting portion are formed at the troughs of the first electrode, and the second connecting portion has a strip shape.

12. The display panel according to claim 9, wherein a plurality of protrusions are formed on the first electrode, and the plurality of protrusions are distributed along the edge of the first electrode.

13. The display panel according to claim 1, wherein the display panel is an Active Matrix Organic Light-Emitting Diode display panel.

14. The display panel according to claim 13, wherein a projection of the first electrode on the substrate is a circle, an ellipse or two circles connected to each other.

15. The display panel according to claim 13, wherein an edge of a projection of the first electrode on the substrate and the edge of the projection of the pixel aperture on the substrate are not parallel to each other.

16. A display screen, comprising:
a first display area displaying a picture; and
the display panel according to claim 1 provided in the first display area.

17. The display screen according to claim 16, further comprising a second display area adjacent to the first display area, the display panel provided in the first display area comprising a Passive-Matrix Organic Light-Emitting Diode display panel or an Active Matrix Organic Light-Emitting Diode display panel, a display panel provided in the second display area comprising an Active Matrix Organic Light-Emitting Diode display panel.

18. A display terminal, comprising:
a device body having a device area; and
the display screen according to claim 16 disposed on the device body;
wherein, the device area is located under the first display area, and photosensitive devices being disposed in the device area.

19. The display terminal according to claim 18, wherein the device area is a notched area, the photosensitive devices comprising a camera or a light sensor.

* * * * *